United States Patent [19]
Gardner

[11] Patent Number: 6,008,521
[45] Date of Patent: Dec. 28, 1999

[54] INTEGRATED CIRCUIT EMPLOYING SIMULTANEOUSLY FORMED ISOLATION AND TRANSISTOR TRENCHES

[75] Inventor: Mark I. Gardner, Cedar Creek, Tex.

[73] Assignee: Advanced Micro Devices, Inc., Sunnyvale, Calif.

[21] Appl. No.: 09/027,573

[22] Filed: Feb. 23, 1998

Related U.S. Application Data

[62] Division of application No. 08/727,358, Oct. 8, 1996, Pat. No. 5,763,310.

[51] Int. Cl.$^6$ .......................... H01L 29/76; H01L 31/113
[52] U.S. Cl. .......................... 257/330; 257/333; 257/374; 257/510; 257/514
[58] Field of Search .................................. 257/327, 330, 257/333, 334, 510, 514, 374

[56] References Cited

U.S. PATENT DOCUMENTS

| | | |
|---|---|---|
| 4,536,782 | 8/1985 | Brown . |
| 4,710,790 | 12/1987 | Okamoto et al. .................. 257/332 |
| 4,830,975 | 5/1989 | Bovaird et al. . |
| 4,945,070 | 7/1990 | Hsu .................................. 438/224 |
| 5,093,273 | 3/1992 | Okumura . |
| 5,559,357 | 9/1996 | Krivokapic ........................ 257/336 |
| 5,640,034 | 6/1997 | Malhi ................................ 257/341 |
| 5,665,990 | 9/1997 | Kang et al. ........................ 257/330 |
| 5,763,310 | 6/1998 | Gardner . |

FOREIGN PATENT DOCUMENTS 60-136369 7/1985 Japan .

Primary Examiner—Jerome Jackson, Jr.
Assistant Examiner—George C. Eckert, II
Attorney, Agent, or Firm—Kevin L. Daffer; Conley, Rose & Tayon

[57] ABSTRACT

A semiconductor fabrication process in which a transistor trench and an isolation trench are simultaneously formed in a semiconductor substrate. The transistor trench is laterally displaced from the isolation trench. Thereafter the isolation trench is filled with an isolation material and a gate dielectric is formed on the floor of the transistor trench. Next, a conductive gate is formed on the gate dielectric and a source/drain impurity distribution is introduced into a source region and a drain region of the semiconductor substrate. The drain region and the source region are laterally disposed on either side of the transistor trench. In a presently preferred embodiment, the semiconductor substrate comprises a substantially single crystal p+ silicon bulk and a p– epitaxial layer formed upon the p+ silicon bulk. Preferably, the process of forming a transistor trench and the isolation trench includes depositing a photoresist layer on an upper surface of the semiconductor substrate, patterning the photoresist layer to expose an upper surface of an isolation trench region and an upper surface of a transistor trench region, anisotropically etching the isolation trench and the transistor trench region with a chlorinated plasma and stripping the photoresist layer. The process of filling the isolation trench with an isolation material preferably comprises depositing an isolation dielectric on the topography defined by the upper surface of the semiconductor substrate and the isolation trench and removing the isolation dielectric from regions exterior to the isolation trench.

14 Claims, 3 Drawing Sheets

INTEGRATED CIRCUIT EMPLOYING SIMULTANEOUSLY FORMED ISOLATION AND TRANSISTOR TRENCHES

This is a Divisional of application Ser. No. 08/727,358 filed Oct. 8, 1996 now U.S. Pat. No. 5,763,310.

BACKGROUND OF THE INVENTION

1. Field of the Invention

This invention relates to the field of semiconductor processing and, more particularly, to a method of forming trench transistors and shallow trench isolation structures using a single trench formation process step.

2. Description of the Relevant Art

The fabrication of an integrated circuit involves placing numerous devices in a single semiconductor substrate. Select devices are thereafter interconnected by a conductor which extends over a dielectric which separates or "isolates" the individual devices. Implementing an electrical path across a monolithic integrated circuit thereby involves selectively connecting isolated devices. When fabricating integrated circuits it must therefore be possible to isolate devices built into the substrate from one another. From this perspective, isolation technology is one of the critical aspects of fabricating a functional integrated circuit.

A popular isolation technology used for an MOS integrated circuit involves the process of locally oxidizing silicon. Local oxidation of silicon, or LOCOS processes involve oxidizing field regions between devices. The oxide grown in field regions is termed field oxide, wherein field oxide is grown during the initial stages of integrated circuit fabrication, before source and drain implants are placed in device areas or active areas. By growing a thick field oxide in field regions pre-implanted with a channel-stop dopant, LOCOS processing serves to prevent the establishment of parasitic channels in the field regions.

While LOCOS has remained a popular isolation technology, there are several problems inherent with LOCOS. First, a growing field oxide extends laterally as a bird's-beak structure. In many instances, the bird's-beak structure can unacceptably encroach into the device active area. Second, the pre-implanted channel-stop dopant oftentimes redistributes during the high temperatures associated with field oxide growth. Redistribution of channel-stop dopant primarily affects the active area periphery causing problems known as narrow-width effects. Third, the thickness of field oxide causes large elevational disparities across the semiconductor topography between field and active regions. Topological disparities cause planarity problems which become severe as circuit critical dimensions shrink. Lastly, thermal oxide growth is significantly thinner in small field (i.e., field areas of small lateral dimension) regions relative to large field regions. In small field regions, a phenomenon known as field-oxide-thinning effect therefore occurs. Field-oxide-thinning produces problems with respect to field threshold voltages, interconnect-to-substrate capacitance, and field-edge leakage in small field regions between closely spaced active areas.

Many of the problems associated with LOCOS technology are alleviated by an isolation technique known as the "shallow trench process". Despite advances made to decrease bird's-beak, channel-stop encroachment and non-planarity, it appears that LOCOS technology is still inadequate for deep sub-micron MOS technologies. The shallow trench process is better suited for isolating densely spaced active devices having field regions less than one micron in lateral dimension.

The trench process involves the steps of etching a silicon substrate surface to a relatively shallow depth, e.g., between 0.05 to 0.5 microns, and then refilling the shallow trench with a deposited dielectric. Some trench processes include an interim step of growing oxide on trench walls prior to the trench being filled with a deposited dielectric. After the trench is filled, it is then planarized to complete the isolation structure.

The trench process eliminates bird's-beak and channel-stop dopant redistribution problems. In addition, the isolation structure is fully recessed, offering at least a potential for a planar surface. Still further, field-oxide thinning in narrow isolation spaces does not occur and the threshold voltage is constant as a function of channel width.

Despite its advantages over LOCOS, the conventional trench isolation process requires dedicated photolithography and dry etch steps to define the isolation trenches prior to the transistor fabrication sequence. These processing steps increase manufacturing costs by heightening the demand for typically scarce photolithography and plasma etch resources. Therefore, it would be desirable if the cost imposed by the addition of a trench formation process sequence enabled additional processing benefits.

The operating characteristics of a transistor fabricated with standard metal-oxide-semiconductor (MOS) integrated circuit techniques are a function of the transistor's dimensions. In particular, the transistor's source-to-drain current ($I_{ds}$) is proportional to the ratio of the transistor's width (W) to the transistor's length (L). For a given transistor width W and a given biasing condition (e.g. $V_G$=3V, $V_D$=3V, and $V_S$=0V), $I_{ds}$ is maximized by minimizing the transistor length L. Minimizing transistor channel length improves the speed of integrated circuits, which comprise a large number of individual transistors, because the larger drain current associated with a short channel length can drive the adjoining transistors into saturation more quickly. Minimizing L is, therefore, desirable from an device operation standpoint. In addition, minimizing the transistor length L is desirable from a manufacturing perspective because a smaller area of silicon is required to manufacture a transistor having a smaller length. By minimizing the area required for a given transistor, the number of transistors available for a given area of silicon increases and, with it, a corresponding increase in the circuit complexity that can be achieved on the given area of silicon.

The main limitation of minimum device size in a conventional transistor fabrication process is the resolution of the optical lithography printing system. In an optical lithography printing system, radiation is directed from an illumination source through a patterned mask and onto a photoresist layer. The patterned mask transmits the illumination source radiation onto selected areas of the photoresist layer to reproduce the mask pattern in the photoresist layer. Resolution in optical lithography systems is limited by diffraction effects, which spread radiation from the illumination source into regions of the photoresist which are not directly exposed to the illumination source. Because of diffraction effects, there is a minimum distance beyond which even a geometrically perfect lens cannot resolve two points. In other words, when two points are less than a minimum distance from each other, the two points cannot be resolved by the lithography system. The diffraction patterns associated with each point overlap each other to such an extent that the two points cannot be effectively differentiated. The resolution of a lens depends on the wavelength of the illumination source and the numerical aperture of the lens. Rayleighs criteria defines two images as being resolvable when the intensity between them drops to 80% of the image intensity. This criteria is satisfied when the 2d=0.61 λ/NA. Where 2d is the separation distance of the two images, λ is the wavelength of the energy source, and NA is the numerical aperture of the lens.

As process technologies approach and surpass the resolvable limits of photolithography aligners, semiconductor manufacturers are typically forced to implement alternative techniques to achieve adequate resolution of the minimum features. Unfortunately, the conventional alternatives involve abandoning or substantially modifying the existing photolithography equipment at a prohibitive cost. For example, it is typically necessary to upgrade photolithography aligners or abandon the optical alignment equipment entirely and replace it with advanced lithography equipment such as e-beam or x-ray lithography equipment to adequately resolve features in the deep sub-micron range (i.e. <0.5 μm). The cost associated with replacing or upgrading photolithography equipment can be prohibitive due to the capital required to purchase and install the improved equipment and the extensive costs associated with qualifying the new equipment for production worthiness and training production and maintenance personnel in the operation and care of the new equipment.

In addition, conventional transistor fabrication processes, in which the transistor gate is formed above the semiconductor substrate, result in a non-planar surface upon which subsequent processing layers must be fabricated. The non-planar surface increases the difficulty of subsequent processing. In particular, photolithography resolution is negatively affected by variations in the thickness of the photoresist layer across non-planar regions or "steps" in the underlying substrate. Photoresist line width variations are common over steps in the underlying substrate primarily due to standing wave effects and light scattering at the steps caused by diffraction and reflection effects. Moreover, it is difficult to fabricate the shallow source/drain junction depth that is required to minimize short channel effects in deep submicron transistor technologies. This is especially true with respect to p-channel devices where the source/drain impurity typically comprises boron which is known to have a high diffusion coefficient. It would therefore be desirable to implement a transistor fabrication process that enables the reduction of the minimum transistor channel length, improves the planarity of the wafer surface upon which the post-fabrication processing sequence occurs, integrates nicely with a shallow trench isolation process, and facilitates the formation of shallow source/drain junctions.

SUMMARY OF THE INVENTION

The problems identified above are in large part addressed by a semiconductor fabrication process in which the transistors and the isolation structures are fabricated in simultaneously formed trenches. The use of transistor trenches permits a fabrication sequence capable of producing transistor channel lengths that are less than the minimum feature size resolvable by the photolithography equipment. In addition, transistors fabricated in trenches permit the formation of extremely shallow source/drain junction depths. By decreasing the junction depth relative to the transistor channel, short channel effects are minimized. The process also includes the use of shallow trench isolation structures. Shallow trench isolation structures provide electrical isolation among the individual transistors of the integrated circuit without undesirably altering the planarity of the semiconductor substrate upper surface and minimize encroachment into the active regions of the transistors. The present invention advantageously integrates the formation of the transistor trenches with the formation of the isolation trenches thereby maximizing the benefit derived from the trench formation process.

Broadly speaking, the present invention contemplates a semiconductor fabrication process in which a transistor trench and an isolation trench are simultaneously formed in a semiconductor substrate. The transistor trench is laterally displaced from the isolation trench. Thereafter the isolation trench is filled with an isolation material and a gate dielectric is formed on the floor of the transistor trench. Next, a conductive gate is formed on the gate dielectric and a source/drain impurity distribution is introduced into a source region and a drain region of the semiconductor substrate. The source region and the drain region are laterally disposed on either side of the transistor trench. In a presently preferred embodiment, the semiconductor substrate comprises a substantially single crystal p− epitaxial layer formed upon a p+ silicon bulk. Preferably, the process of forming a transistor trench and the isolation trench includes depositing a photoresist layer on an upper surface of the semiconductive substrate, patterning the photoresist layer to expose an upper surface of an isolation trench region and an upper surface of a transistor trench region, anisotropically etching the isolation trench and the transistor trench region with a fluorine bearing plasma and stripping the photoresist layer. The process of filling the isolation trench with an isolation material preferably comprises depositing an isolation dielectric on the topography defined by the upper surface of the semiconductor substrate and the isolation trench and removing the isolation dielectric from regions exterior to the isolation trench. In one embodiment, the isolation dielectric is a CVD oxide formed from a TEOS or a silane source. The isolation dielectric is removed from the regions exterior to the isolation trench with a planarization process preferably including a chemical mechanical polish.

The gate dielectric ideally comprises a thermal oxide having a thickness of approximately 20 to 200 angstroms formed on the transistor trench floor. The formation of the conductive gate, in a presently preferred embodiment, includes chemically vapor depositing a polysilicon layer on the gate dielectric and removing portions of the polysilicon layer exterior to the transistor trench, preferably with a chemical mechanical polish. In the preferred embodiment, the source/drain impurity distribution is introduced into the semiconductor substrate by ion implanting impurities of boron, phosphorous or arsenic. The implant energy of the ion implantation is preferably adjusted such that a peak concentration of the source/drain impurity distribution is located a depth below the upper surface of the semiconductor substrate approximately one-half of the depth of the transistor trench. The source/drain impurity distribution ideally extends to a depth below the upper surface approximately equal to a depth of the transistor trench. To achieve further integration in the present invention, the ion implant process preferably used to introduce the source/drain impurity distribution into the semiconductor substrate simultaneously introduces impurities into the conductive gate such that a sheet resistivity of the conductive gate is less than approximately 500 Ω/sq.

In an embodiment of the present invention designed to achieve short transistor channels, the process preferably further includes, prior to the forming of the gate dielectric, filling the transistor trench with a spacer material and forming a spacer structure within the transistor trench by removing the portion of the spacer material situated over a channel region of the semiconductor substrate. The channel region preferably extends laterally from a first sidewall of the transistor trench to a position intermediate between the first sidewall and the second sidewall. Accordingly, a lateral dimension of the transistor channel region is less than a lateral dimension of the transistor trench. If the transistor trench is fabricated with lateral dimension approximately equal to a minimum feature size achievable by the photolithography equipment, then the lateral dimension of the transistor channel region will be less than the minimum feature size of the photolithography equipment. Ideally, the process of filling the transistor trench is accomplished by chemically vapor depositing an oxide formed from a TEOS or silane source. In one embodiment, the filling of the transistor trench and the filling of the isolation trench are achieved with the same deposition process. The short channel fabrication process further preferably includes, subsequent to the introduction of the source/drain impurities distribution into the semiconductor substrate, the steps of removing an upper portion of the spacer structure thereby forming an implant displacement structure and introducing a source side impurity distribution into a source side impurity region of the semiconductor substrate. The source side impurity region extends approximately from a second sidewall of the transistor trench to the channel region. In this manner, the source side impurity distribution will electrically connect the source region to the channel region.

The present invention further contemplates an integrated circuit. The integrated circuit includes a semiconductor substrate having first and second active regions laterally disposed on either side of an isolation structure. The first and second active regions of the semiconductor substrate each include a transistor trench extending downward a trench depth below an upper surface of the semiconductor substrate. The integrated circuit further includes a first transistor formed within the first active region of the semiconductor substrate and a second transistor formed within the second active region of the semiconductor substrate. The first and the second transistor each comprise a gate dielectric formed on a floor of the transistor trench, a conductive gate in contact with the gate dielectric, a source/drain impurity distribution within a source region and a drain of the semiconductor substrate, and a source side impurity distribution. The gate dielectric is formed on a floor of the transistor-trench such that the gate dielectric is vertically displaced below the upper surface of the semiconductor substrate by a depth of the transistor trench. The conductive gate is in contact with the gate dielectric above a channel region of the semiconductor substrate. The channel region is vertically displaced below the trench floor and extends laterally from a first sidewall of the transistor trench to a position intermediate between the first sidewall and a second sidewall of the transistor trench. Therefore, a lateral dimension of the channel region is less than a lateral dimension of the transistor trench. The source/drain impurity distribution is located within a source region and a drain region of the semiconductor substrate. The source region and the drain region are laterally displaced on either side of the transistor trench. The source and drain regions extend vertically from an upper surface of the semiconductor substrate to a depth below the upper surface that is approximately equal to a depth of the transistor trench plus an extremely shallow junction depth. The source side of the impurity distribution extends laterally from the source region to the channel region of the semiconductor substrate. In an NMOS embodiment of the present invention, the first and second transistors are n-channel transistors. In a PMOS embodiment the first and second transistors comprise p-channel transistors.

Finally, in a CMOS embodiment the first transistor is preferably an n-channel transistor and the second transistor is preferably a p-channel transistor.

BRIEF DESCRIPTION OF THE DRAWINGS

Other objects and advantages of the invention will become apparent upon reading the following detailed description and upon reference to the accompanying drawings in which.

Figure 1:
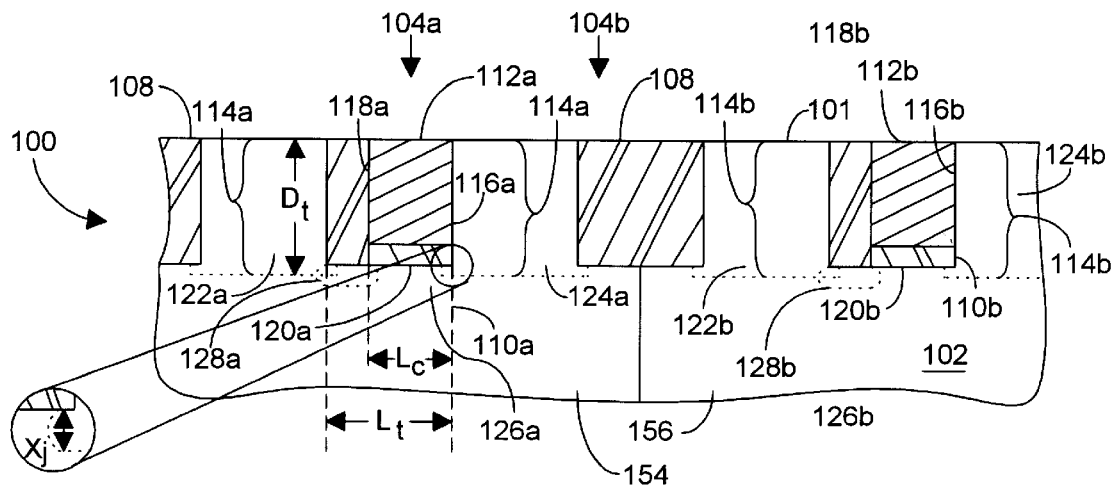
FIG. 1 is partial cross-sectional view of an integrated circuit according to the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

Detailed Description of the Invention

Turning now to the drawings, FIG. 1 is a partial cross-sectional view of an integrated circuit according to the present invention. First transistor 104a and second transistor 104b are electrically isolated by isolation structure 108, which is laterally displaced between first transistor 104a and second transistor 104b. Regions of semiconductor substrate 102 exposed by pattern masking layer 141 define the various trench regions. Integrated circuit 100 includes first transistor 104a and second transistor 104b formed in semiconductor substrate 102. Semiconductor substrate 102 includes a first active region 142a (shown in FIG. 2) and second active region 142b laterally disposed on either side of an isolation region 140. First active region 142a includes a transistor trench 144a (shown in FIG. 3) and second active region 142b includes a second transistor trench 144b. Transistor trenches 144 extend downward a trench depth $D_t$ below upper surface 101 of semiconductor substrate 102. Returning to FIG. 1, each transistor 104 includes a gate dielectric 110 formed on a floor 120 of transistor trench 144 such that gate dielectric 110 is vertically displaced below upper surface 101 of semiconductor substrate 102 by an approximate distance of the transistor depth $D_t$. A conductive gate 112 is formed in contact with gate dielectric 110 above a channel region 126 of semiconductor substrate 102. Channel region 126 is vertically displaced below trench floor 120 and extends laterally from a first sidewall 116 of transistor trench 144 to a position intermediate between first sidewall 116 and a second sidewall 118. Accordingly, a lateral dimension $L_c$ of channel region 136 is less than a lateral dimension $L_t$ of transistor trench 144. Transistor 104 further includes a source/drain impurity distribution 114 within a source region 122 and a drain region 124 of semiconductor substrate 102. Source region 122 and drain region 124 are laterally disposed on either side of transistor trench 144. Source region 122 and drain region 124 extend vertically from upper surface 101 of semiconductor substrate 102 to a depth approximately equal to the depth $D_t$ of transistor trench 144 plus a junction depth $x_j$. By forming gate dielectric 120 below upper surface 101 of semiconductor substrate 102, it is possible to produce extremely shallow junction depths (i.e. $x_j$ is less than approximately 0.2 microns). Shallow junction depths are desirable to minimize threshold voltage variability between long channel and short channel devices within an integrated circuit. Short channel devices (i.e. devices with channel lengths less than approximately 2.0 microns) have lower threshold voltages, in absolute value terms, than their long channel counterparts in part due to the depletion region surrounding reversed bias source/drain-to-substrate junctions. These depletion regions can rob the short channel of carriers and, accordingly, a lower gate voltage is necessary to fully deplete and ultimately induce the onset of strong inversion of the channel. See, e.g. S. M. Z Sze, *Physics of Semiconductor Devices* 469–74 (John Wiley & Sons 1981). Accordingly, source/drain region 114 extends below upper surface 101 of semiconductor substrate 102 to a depth greater than the depth $D_t$ of transistor trench 144 by a junction depth $x_j$ that is approximately 0.2 microns or less.

In the preferred embodiment, integrated circuit 100 includes a source side impurity distribution within a source side impurity region 128 of semiconductor substrate 102. The source side impurity region 128 provides an electrical path from source region 122 to channel region 126 in those embodiments of integrated circuit 100 in which the lateral dimension $L_c$ of channel region 126 is less than a lateral dimension $L_t$ of transistor trench 144. In the preferred embodiment, the source side impurity distribution within source side impurity region 128 is heavily doped (i.e. doping concentration greater than approximately $1 \times 10^{19}$ atoms/$cm^3$). Because it is contemplated that, during normal circuit operation, source region 128 is grounded, no reverse bias will exist between source side impurity region 128 and substrate 102 and, accordingly, concerns about hot electron injection and depleting channel region 126 of carriers are minimized. It will be appreciated to those skilled in the art of semiconductor processing that, if transistor trench 144 is fabricated such that lateral dimension $L_t$ of transistor trench 144 is approximately equal to a minimum feature size achievable by the photolithography apparatus used to define transistor trench 144, then lateral dimension $L_c$ of channel region 126 will be adjustably less than the minimum feature size characteristic of the photolithography equipment. Accordingly, the present invention is capable of extending the useful life of existing photolithography equipment. It will be further appreciated that integrated circuit 100 may be of the NMOS, PMOS, or CMOS embodiment. In a CMOS embodiment, first transistor 104a is formed within a first well 154 while second transistor 104b is formed within second well 156.

Figure 2:
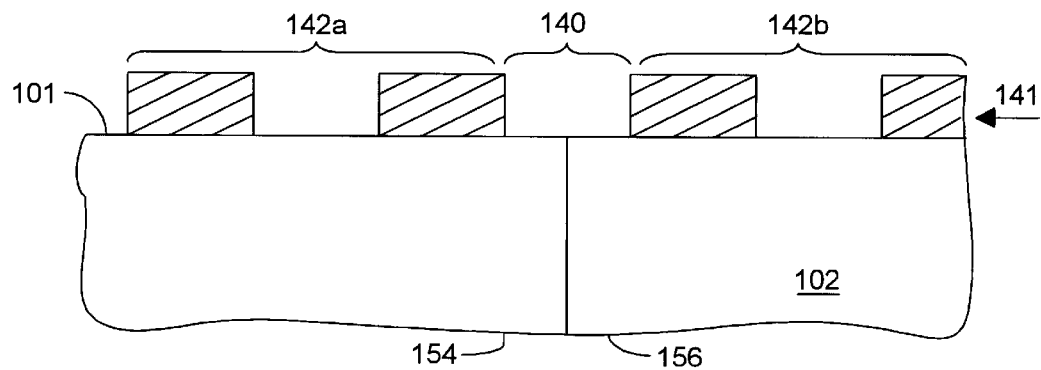
FIG. 2 is a partial cross-sectional view of a semiconductor substrate upon which a patterned masking layer has been formed.

Turning now to FIGS. 2–11, processing sequences for achieving integrated circuit 100 are depicted. In FIG. 2, patterned photoresist layer 141 is formed upon upper surface 101 of semiconductor substrate 102. In a presently preferred CMOS embodiment, semiconductor substrate 102 is preferably a p+ silicon bulk upon which p– epitaxial layer having a resistivity of approximately 10 to 15 Ω-cm is formed. Further, the preferred CMOS embodiment incorporates the formation of p-well and n-well regions within the epitaxial layer. In FIG. 2, a first well 154 has been formed encompassing first active region 142a of semiconductor substrate 102 and a second well 156 has been formed encompassing second active region 142b of semiconductor substrate 102. The well formation process is suitably accomplished by implanting appropriate impurity distributions into the appropriate well regions in conjunction with conventional masking steps. More specifically, if first well region 154 comprises the p-well region of a CMOS integrated circuit, the impurities introduced into first well region 154 are preferably ions of boron. In such an embodiment, second well 156 is preferably achieved by implanting ions of phosphorous into second well region 156 of semiconductor substrate 102. Patterned masking layer 141 is used to simultaneously define the regions of semiconductor substrate 102 into which transistor trenches 144 and isolation trenches 146 will be formed.

Figure 3:
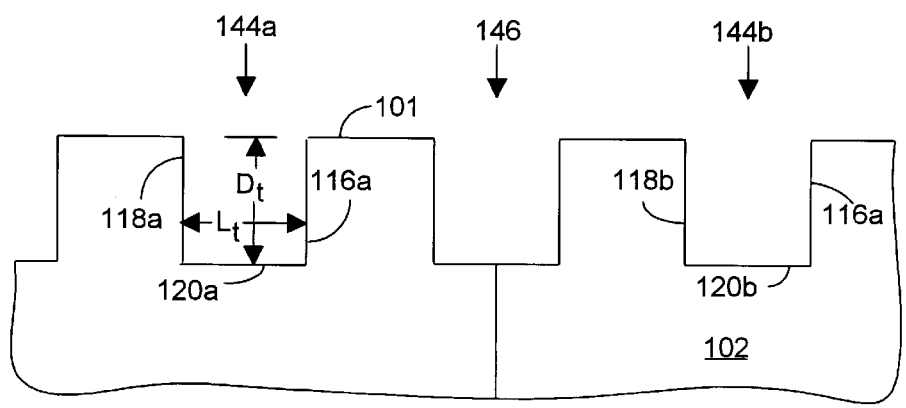
FIG. 3 is a processing step subsequent to FIG. 2 in which isolation and transistor trenches have been formed in the semiconductor substrate.

Turning to FIG. 3, transistor trenches 144 and isolation trenches 146 are formed within semiconductor substrate 102. The formation of the transistor trenches 144 and isolation trenches 146, in a presently preferred embodiment, is achieved by a plasma anisotropic etch process in which the plasma contains fluorine, and possibly, chlorine. Fluorine containing plasmas are known to etch silicon at a desirable etch rate while chlorine bearing plasmas are sometimes used when it is desirable to selectively etch silicon. The use of an anisotropic etch process results in transistor trench 144 having a substantially vertical first sidewall 116 and a substantially vertical second sidewall 118. Transistor trench 144 further includes trench floor 120 disposed between first sidewall 116 and second sidewall 118. Trench floor 120 is located a transistor depth $D_t$ below upper surface 101 of semiconductor substrate 102. In a presently preferred embodiment, trench depth $D_t$ is between approximately 0.3 to 0.5 microns. Still further preferably, a lateral dimension $L_t$ transistor trench 144, which is effectively defined by patterned masking layer 141 of FIG. 2, is approximately equal to the minimum feature resolvable by the photolithography equipment used to pattern photoresist layer 141. As an example, in an embodiment in which photoresist layer 141 is patterned with an I-line aligner, a suitable minimum lateral dimension $L_t$ of transistor trench 144 is approximately 0.35 microns. The use of a single mask and etch step process to simultaneously form transistor trench 144 and isolation trench 146 minimizes the front end processing requirements of the present invention. In an alternative embodiment, however, transistor trench 144 and isolation trench 146 may be formed with separate processing sequences if it is desired to independently control the depths of the trenches.

Figure 4:
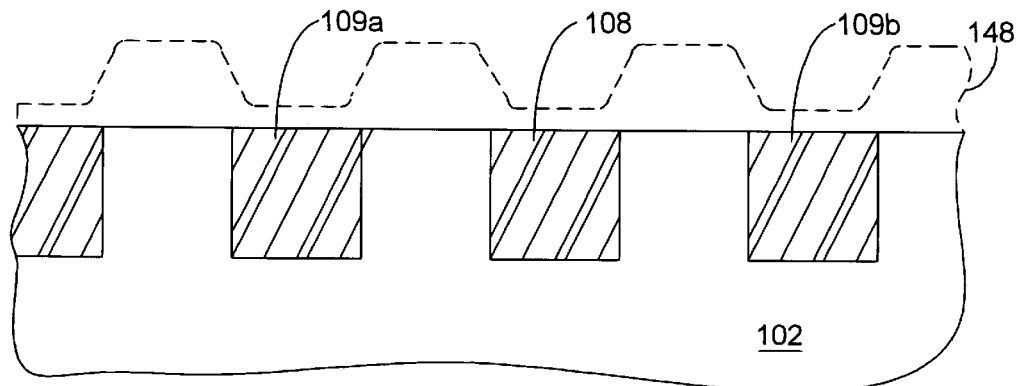
FIG. 4 is a processing step subsequent to FIG. 3 in which the trenches have been filled with a dielectric material.

Turning to FIG. 4, transistor trench 144 and isolation trench 146 are filled with a transistor trench material and an isolation trench material respectively. In the preferred embodiment, transistor trench 144 and isolation trench 146 are filled simultaneously using a single deposition step. In such an embodiment, an isolation dielectric layer 148 is deposited upon the topography defined by upper surface 101 of semiconductor substrate 102, transistor trench 144, and isolation trench 146. The deposition of isolation dielectric 148 is preferably achieved with the use of a chemical vapor deposition process using a TEOS or silane source. After deposition, portions of isolation dielectric layer 148 exterior to trenches 144 and 146 are removed. The removal of this excess isolation dielectric material is preferably accomplished with a planarization process such as a chemical mechanical polish possibly in conjunction with conventional wet or plasma etch processing. The portions of isolation dielectric 148 removed during this planarization process are shown in phantom in FIG. 4. The preferred planarization process results in a substantially planar upper surface 101 of semiconductor substrate 102 across the various trench regions. In addition, the planarization process results in the formation of an isolation dielectric structure 108 and transistor dielectric structure 109.

Figure 5:
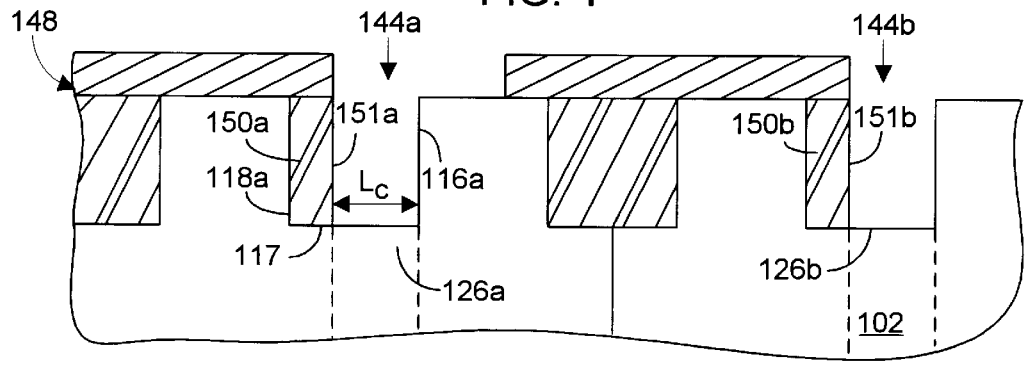
FIG. 5 is a processing step subsequent to FIG. 4 in which a portion of the transistor trench material has been removed over a channel region within the semiconductor substrate.

Turning to FIG. 5, portions of transistor dielectric structure 109 are removed above channel region 126 of semiconductor substrate 102 through the use of a patterned masking layer 148. Channel region 126 extends laterally from first sidewall 116 of transistor trench 144 to intermediate position 117 laterally displaced between first sidewall 116 and second sidewall 118 of transistor trench 144. The patterning of pattern photoresist layer 148 is achieved with a conventional photoresist masking process. The removal of portions of transistor dielectric structure 109 above channel region 126 results in the formation of spacer structure 150. In the preferred embodiment, spacer structure 150 extends laterally from second sidewall 118a of transistor trench 144 to intermediate position 117. In the presently preferred embodiment, the removal portions of transistor dielectric structure 109 is accomplished with a dry anisotropic etch such that an interior sidewall 151 of spacer structure 150 is substantially vertical. It will be appreciated to those skilled in the art that a lateral dimension of spacer structure 150 and, thus, a lateral dimension $L_c$ of channel region 126 is adjusted simply by altering the photomask used. Therefore, the lateral dimension $L_c$ of channel region 126a is controllably and adjustably less than the lateral dimension $L_t$ of transistor trench 144. By fabricating transistor trench 144 with a lateral dimension $L_t$ that is approximately equal to a minimum feature size of the photolithography equipment, the critical dimension of the channel region 126 is less than the feature size achievable with the use of the photolithography equipment alone. Moreover, patterned masking layer may be adjusted such that the lateral dimension $L_c$ of first transistor 144a is slightly less than or greater than a lateral dimension of second channel region 126b of second transistor 146b. Such an adjustment might be desirable to optimize the minimum dimension of p-channel and n-channel devices in a CMOS embodiment of the present invention.

Figure 6:
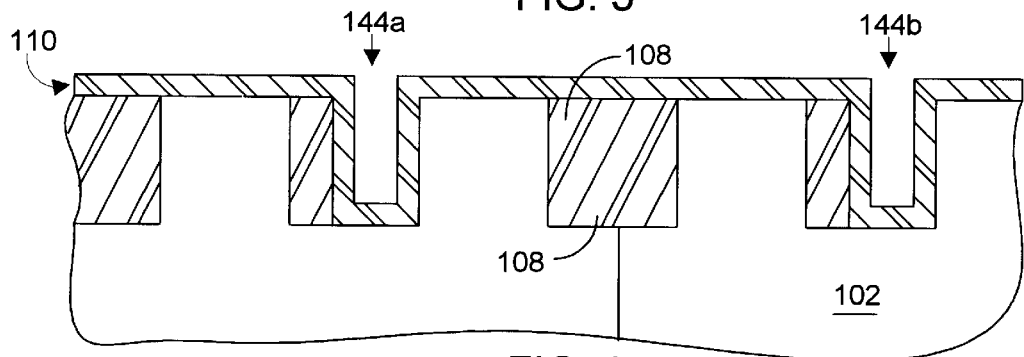
FIG. 6 is a processing step subsequent to FIG. 5 in which a gate dielectric has been formed upon a topography cooperatively defined by the semiconductor substrate upper surface and the transistor trench.
Figure 7:
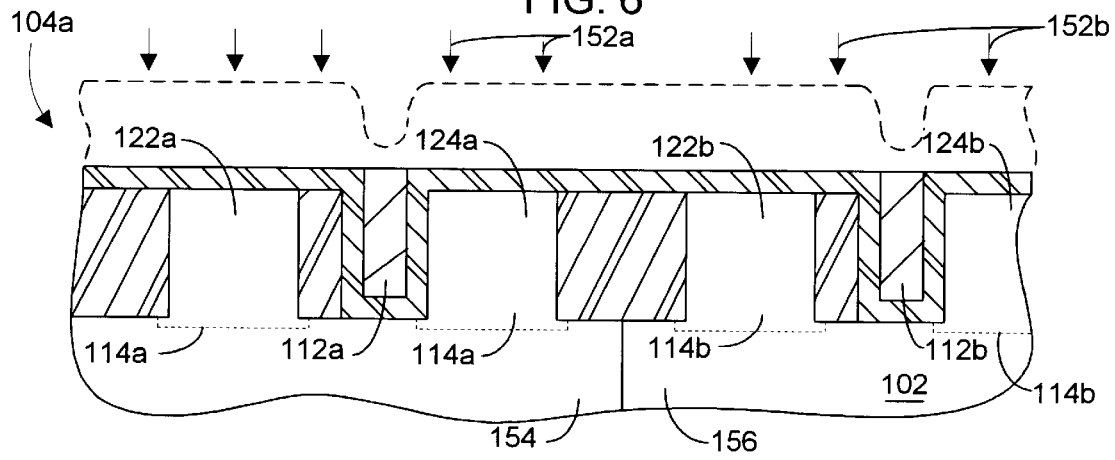
FIG. 7 is a processing step subsequent to FIG. 6 in which a source/drain impurity distribution has been introduced into the semiconductor substrate.

Turning now to FIG. 6 a gate dielectric 110 is formed on the topography defined by semiconductor substrate 102 and transistor trench 144. Gate dielectric 110 is ideally formed by thermally oxidizing silicon substrate 102 to produce a thermal oxide film of approximately 20 to 200 angstroms in thickness. Moving now to FIG. 7, transistor trench 144 has been filled with a conductive material 150 to form conductive gate 112 and, thereafter, a source/drain impurity distribution 114 has been introduced into source regions 122 and drain region 124 of semiconductor substrate 102. The formation of conductive gate structure 112 is preferably achieved by chemical vapor depositing conductive material 150, preferably comprising polysilicon, upon the topography defined by semiconductor substrate 102 and transistor trench 144. To achieve adequate deposition rates and film composition, the deposition of polysilicon, in the preferred embodiment, is ideally performed at a temperature of greater than approximately 580° C. Subsequent to deposition, the conductive material 150 is planarized with a suitable planarization process such as a chemical mechanical polish to remove portions of conductive material 150 exterior to transistor trench 144 thereby forming conductive gate structure 112. The portions of conductive material 150 removed during the planarization process are represented in phantom in the figure. Subsequent to the formation of conductive gate 112, source/drain impurity distribution 114 is introduced into source region 122 and drain regions 124 of semiconductor substrate 102. Preferably, the introduction of source/drain impurity distribution 114 into semiconductor substrate 102 is accomplished with an ion implantation process denoted in the figure as reference numerals 152a and 152b. It will be appreciated that in a CMOS embodiment, ion implantation 152a may represent the implantation of n-type dopants such as phosphorous or arsenic into source region 122a and drain region 124a of first transistor 104a while ion implantation 152b may represent the introduction of p-type impurities such as boron into source region 122b and drain region 124b of second transistor 104b. It will be further appreciated that ion implantation 152 desirably introduces the appropriate impurity into conductive gate 112 thereby reducing the sheet resistivity of conductive gate 112. More specifically, ion implantation step 152a may introduce boron or phosphorous into conductive gate 112a of first transistor 104a in a CMOS embodiment in which first transistor 104a comprises an n-channel transistor. Similarly, ion implantation 152b introduces boron or other p-type impurity into conductive gate 112b of second transistor 104b in an embodiment in which second transistor 104b is a p-channel transistor. The conventional use of photoresist masking layers enables the introduction of implant step 152a and 152b into selected regions of semiconductor substrate 102. In a presently preferred embodiment, in which source/drain impurity distribution 114 is introduced into semiconductor substrate 102 through the use of ion implantation, the ion implantation energy is adjusted such that a peak concentration of source/drain impurity distribution 114 occurs at a depth below upper surface 101 of semiconductor substrate 102 approximately equal to one half the depth $D_t$ of transistor trench 144. Still further preferably, impurity distribution 114 is formed such that impurity distribution 114 extends from upper surface 101 of semiconductor substrate 100 to a depth below upper surface 101 greater than the depth $D_t$ of transistor trench 144 by a junction depth $x_j$ that is preferably 0.2 microns or less. Careful control of the ion implantation energy and the post implantation high temperature processing is required to ensure that the impurity distribution within conductive gate 112 does not migrate through gate dielectric 110 into channel region 126 of transistor 104.

Figure 8:
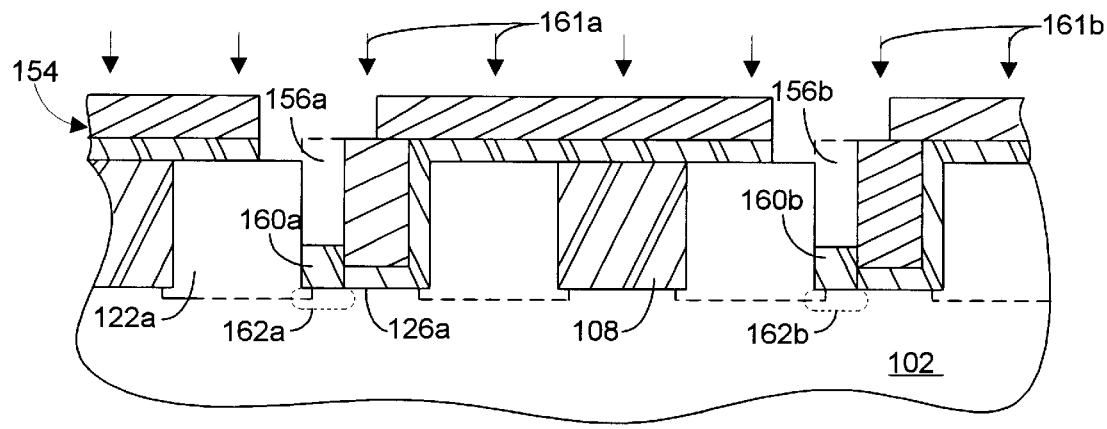
FIG. 8 is a processing step subsequent to FIG. 7 in which a source side impurity distribution has been introduced into the semiconductor substrate.
Figure 9:
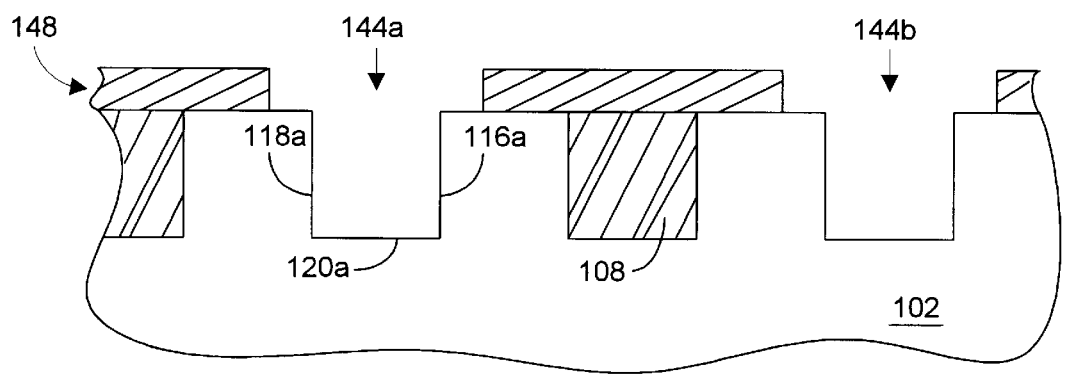
FIG. 9 is a processing step subsequent to FIG. 4 in which all of the material within the transistor trench has been removed.
Figure 10:
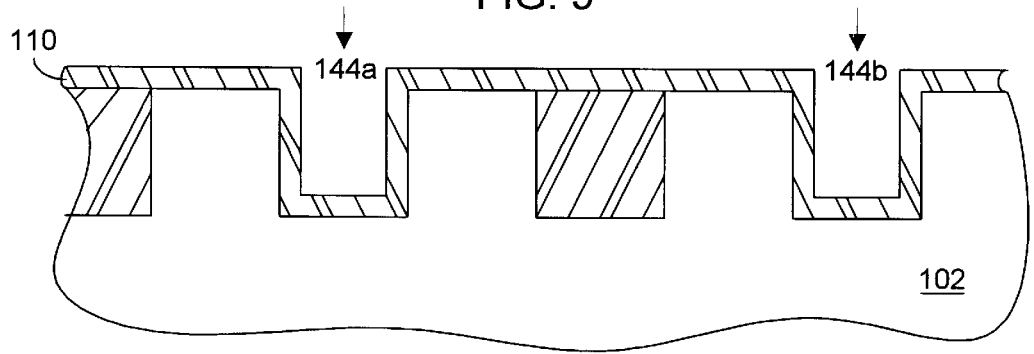
FIG. 10 is processing step subsequent to FIG. 9 in which a gate dielectric has been formed upon a topography cooperatively defined by an upper surface of the semiconductor substrate and the transistor trench.
Figure 11:
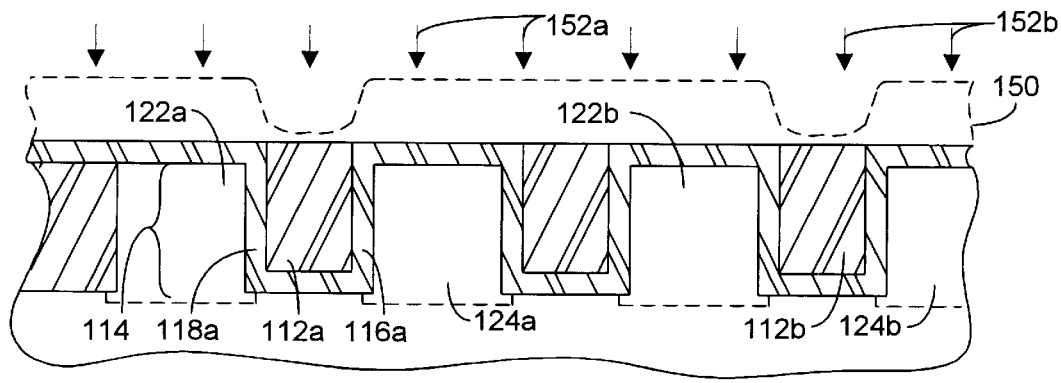
FIG. 11 is a processing step-subsequent to FIG. 10 in which a source/drain impurity distribution has been introduced into the semiconductor substrate.

Turning now to FIG. 8 an upper region 156 of spacer structure 150 is removed leaving behind an implant displacement layer 160. The selective removal of upper regions 156 of spacer structure 150 is accomplished through the use of a patterned photoresist layer 154 designed to protect dielectric material within isolation structure 108. The removal of upper region 156 of spacer structure 150 is performed to facilitate the selective introduction of an impurity distribution into a region of semiconductor substrate laterally displaced between source region 122 and channel region 126 of semiconductor substrate 102. Accordingly, FIG. 8 shows a source side ion implantation 161 preferably used to introduce an impurity distribution into source side region 162 of semiconductor substrate 102. Source side region 162 is vertically displaced below transistor trench floor 120 and laterally displaced between source region 122 and channel region 126. In a presently preferred embodiment, source side region 162 comprises a heavily doped region having the same conductivity type as source region 122a. For purposes of this disclosure, a heavily doped region is defined as a region in which the impurity concentration is greater than approximately $1 \times 10^{19}$ atoms/cm$^3$. Source side impurity region 162 provides the electrical link between source region 122 and channel region 126 and is required because channel region 126, and similarly, conductive gate 112 extend only partially across transistor trench 144. Short channel effects such as decreased threshold voltage and increased occurrence of hot electron injection normally associated with heavily doped source/drain regions in short channel devices are lessened in the present invention because it is contemplated that source region 122 is grounded during normal operation. Accordingly, it is believed that the maximum electric field and the extent of the depletion region surrounding source side region 162 will be minimized and will, therefore minimize the short channel effects described. FIGS. 9–11 show an alternative processing sequence to the processing sequence shown in FIGS. 5–8. In the processing sequence of FIGS. 9–10, it is observed that the spacer structure is eliminated and that the channel length of the subsequently formed transistor has an effective channel length approximately equal to the lateral dimension $L_t$ of transistor trench 144. The embodiment shown in FIGS. 9–11, is therefore, somewhat simpler and less expensive because of the elimination of a masking layer but is not capable of producing channel lengths that are shorter than the lateral dimension of the transistor trench. Comparing FIG. 9 to FIG. 5, it is observed that all of the dielectric within transistor trench 144 is removed in the processing sequence of FIG. 9. This difference is achieved simply by altering patterned masking layer 148 such that transistor trench 144 is completely exposed. The gate dielectric formation process shown in FIG. 10 is substantially identical to the gate dielectric formation process shown in FIG. 6. Similarly, the process of introducing source/drain impurity distribution 114 in FIG. 11 is substantially identical to the process shown in FIG. 7. Because, however, no spacer structure exists in the sequence of FIGS. 9–11, a subsequently formed gate structure 112 (shown in FIG. 11) extends laterally from first sidewall 116 to second sidewall 118 of transistor trench 144. Accordingly, conductive gate structure 112 extends from source 122 to drain region 124 and eliminates the need for a separately formed source side impurity distribution as is required in the processing sequence shown in FIG. 8.

It will be appreciated to those skilled in the art having the benefit of this disclosure that this invention is capable of forming a transistor having an effective channel length that is shorter than the minimum feature size resolvable by a photolithography exposure device and resulting in a substantially planar upper surface. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. An integrated circuit, comprising:
    a semiconductor substrate, wherein said semiconductor substrate includes a first and a second active region laterally disposed on either side of an isolation structure and wherein said first and second active region each include a transistor trench extending downward a trench depth below an upper surface of said semiconductor substrate;
    a first transistor formed within said first active region of said semiconductor substrate; and
    a second transistor formed within said second active region of said semiconductor substrate, wherein said first and said second transistor each comprise:
        a gate dielectric formed on a floor of said transistor trench such that said gate dielectric is vertically displaced a transistor trench depth below said upper surface of said semiconductor substrate;
        a conductive gate in contact with said gate dielectric above a channel region of said semiconductor substrate wherein said channel region is vertically displaced below said trench floor extending laterally from a first sidewall of said transistor trench to a position intermediate between said first sidewall and a second sidewall of said transistor trench such that a lateral dimension of said channel region is less than a lateral dimension of said transistor trench;
        a source/drain impurity distribution within a source region and a drain region of said semiconductor substrate, wherein said source region and said drain region are laterally disposed on either side of said transistor trench extending vertically from an upper surface of said semiconductor substrate to a depth approximately equal to said trench depth; and
        a source side impurity distribution extending laterally from said source region to said channel region of said semiconductor substrate.

2. The integrated circuit of claim 1 wherein said source/drain impurity distribution of said first and second transistors comprise ions selected from the group consisting of phosphorous and arsenic, and further wherein a conductivity of said channel region is p-type such that said transistors each comprise an n-channel transistor.

3. The integrated circuit of claim 1 wherein said source/drain impurity distribution of said first and second transistors comprise boron ions, and further wherein a conductivity of said channel region is n-type such that said transistors each comprise a p-channel transistor.

4. The integrated circuit of claim 1 wherein said first transistor is an n-channel transistor and said second transistor is an p-channel transistor.

5. The integrated circuit of claim 1, wherein said source side impurity distribution comprises an impurity distribution of the same conductivity type as said source/drain impurity distribution.

6. The integrated circuit of claim 5, wherein said source side impurity distribution comprises a higher concentration of impurities than said source/drain impurity distribution.

7. The integrated circuit of claim 6, wherein said source side impurity distribution comprises a impurity concentration of greater than approximately $1\times10^{19}$ atoms/cm$^3$.

8. The integrated circuit of claim 1, wherein said source region and said drain region both extend a junction depth below the trench depth.

9. The integrated circuit of claim 8, wherein said junction depth is less than approximately 0.2 microns.

10. An integrated circuit, comprising:
   a transistor trench defined within an active region of a semiconductor substrate, wherein said transistor trench extends below an upper surface of said semiconductor substrate;
   a transistor formed within said active region, the transistor comprising:
      a gate dielectric arranged within said transistor trench;
      a conductive gate arranged within the transistor trench and above said gate dielectric;
      a channel region within the semiconductor substrate, wherein said channel region is vertically displaced below said conductive gate, and wherein said channel region extends laterally between a first sidewall of said transistor trench and a position intermediate between said first sidewall and a second sidewall of said transistor trench;
      a source region and a drain region arranged within said semiconductor substrate on opposite sides of said transistor trench, wherein said source region and said drain region each vertically extend from an upper surface of said semiconductor substrate to a depth below said trench; and
      a heavily doped impurity distribution arranged within said semiconductor substrate, wherein said heavily doped impurity region laterally extends from said second sidewall of the transistor trench to the channel region.

11. The integrated circuit of claim 10, wherein both said source region and said drain region comprise an impurity distribution, and wherein the impurity distribution within said source region is the same type as said impurity distribution within said drain region.

12. The integrated circuit of claim 10, The integrated circuit of claim 8, wherein said source region and said drain region extend a junction depth below said trench, and wherein said junction depth is less than approximately 0.2 microns.

13. The integrated circuit of claim 10, wherein said source region and said drain region both comprise a source/drain impurity distribution, and wherein the heavily doped impurity distribution comprises an impurity distribution of the same type as the source/drain impurity distribution, and wherein the heavily doped impurity distribution comprises a higher concentration of impurities than said source region or said drain region.

14. The integrated circuit of claim 13, wherein said heavily doped impurity distribution comprises a impurity concentration of greater than approximately $1\times10^{19}$ atoms/cm$^3$.

* * * * *